United States Patent [19]
Illegems

[11] Patent Number: 6,127,854
[45] Date of Patent: Oct. 3, 2000

[54] DIFFERENTIAL COMPARATOR WITH STABLE SWITCHING THRESHOLD

[75] Inventor: Paul F. Illegems, Albuquerque, N. Mex.

[73] Assignee: Philips Electronics North America Corporation, New York, N.Y.

[21] Appl. No.: 09/218,557

[22] Filed: Dec. 22, 1998

Related U.S. Application Data

[60] Provisional application No. 60/093,457, Jul. 20, 1998.

[51] Int. Cl.[7] .................................................. H03K 5/22
[52] U.S. Cl. .............................................. 327/66; 327/89
[58] Field of Search ................................. 327/65, 66, 77, 327/89; 330/311

[56] References Cited

U.S. PATENT DOCUMENTS

| | | |
|---|---|---|
| 5,172,017 | 12/1992 | Schmidt ..................................... 327/65 |
| 5,311,085 | 5/1994 | Pelgrom et al. .......................... 307/494 |
| 5,396,131 | 3/1995 | Miki et al. ................................. 327/65 |
| 5,517,134 | 5/1996 | Yaklin ....................................... 327/65 |

*Primary Examiner*—Toan Tran
*Attorney, Agent, or Firm*—Robert J. Kraus

[57] ABSTRACT

A differential threshold comparator is provided which includes an input stage and a threshold stage, both supplied with current by a common current mirror. Both stages are differential comparators, with the input stage having terminals for receiving an input signals and the threshold stage having terminals for receiving a threshold voltage. The threshold comparator produces a signal which indicates whether the difference between input signal voltages exceeds the threshold voltage.

3 Claims, 3 Drawing Sheets

DIFFERENTIAL COMPARATOR WITH STABLE SWITCHING THRESHOLD

This application claims benefit of provisional application No. 60/093457, filed Jul. 20, 1998.

BACKGROUIND OF THE INVENTION

1. Field of the Invention

The invention relates to a differential threshold comparator and, in particular, to such a comparator which changes state at a stable threshold despite substantial variations in a common mode input level.

2. Description of Related Art

A differential threshold comparator is one which changes state whenever signal levels applied to first and second inputs of the comparator differ by a predetermined threshold magnitude. Such a comparator is described in U.S. Pat. No. 5,517,134. As stated in that patent, conventional differential comparators which use an offset voltage to establish a predetermined threshold magnitude are destabilized by variations in the common mode level at the inputs of the comparator. The patent proposes to correct this problem by providing circuitry which includes means for setting the offset voltage by referencing it to the common mode input voltage. Unfortunately, however, this approach adds complexity to the comparator.

SUMMARY OF THE INVENTION

It is an object of the invention to provide a differential threshold comparator which maintains a relatively stable threshold level over a wide range of variation of the input common mode level, without overly complicating the comparator.

It is another object of the invention to provide such stability without referencing the threshold level to the common mode input level.

In accordance with the invention, the differential threshold comparator includes:

- a plurality of terminals including a first input terminal for receiving a first input signal; a second input terminal for receiving a second input signal; an output terminal for supplying an output signal; and first and second power supply terminals;
- a current mirror having a terminal coupled to the first power supply terminal a first current mirror terminal, and a second current mirror terminal;
- an input stage including third and fourth transistors, the third transistor having a first terminal coupled to the second input terminal, a second terminal coupled to the first current supply terminal, and a third terminal; the fourth transistor having a first terminal coupled to the first input terminal, a second terminal coupled to the second current supply terminal, and a third terminal;
- a threshold voltage source coupled to the second power supply terminal and having first and second reference voltage terminals, the source providing at the reference voltage terminals respective first and second reference voltages having a difference corresponding to the threshold voltage;
- a threshold stage including fifth and sixth transistors; the fifth transistor having a first terminal coupled to the first reference voltage terminal, a second terminal coupled to the first current mirror terminal, and a third terminal; the sixth transistor having a first terminal coupled to the second reference voltage terminal, a second terminal coupled to the second current mirror terminal, and a third terminal; and
- a bias current stage including first and second current sources for supplying predetermined first and second currents to the input stage and to the threshold stage, respectively; the first current source coupling the third terminals of the third and fourth transistors to the second power supply terminal; and the second current source coupling the third terminals of the fifth and sixth transistors to the second power supply terminal.

Variations in the common mode voltage at the input terminals, over a wide range, do not cause substantial changes in the sensed input voltage at which the comparator output changes state.

In a modified version of the invention, this performance is even further extended, into a range of common mode input voltages approaching zero. This is achieved by electrically connecting in series, between the threshold stage and the second current source of the bias current stage, a duplicate input stage including seventh and eighth transistors having electrical characteristics which substantially match corresponding electrical characteristics of the first and second transistors, respectively.

DESCRIPTION OF THE PREFERRED EMBODIMENTS

First Embodiment

Figure 1:
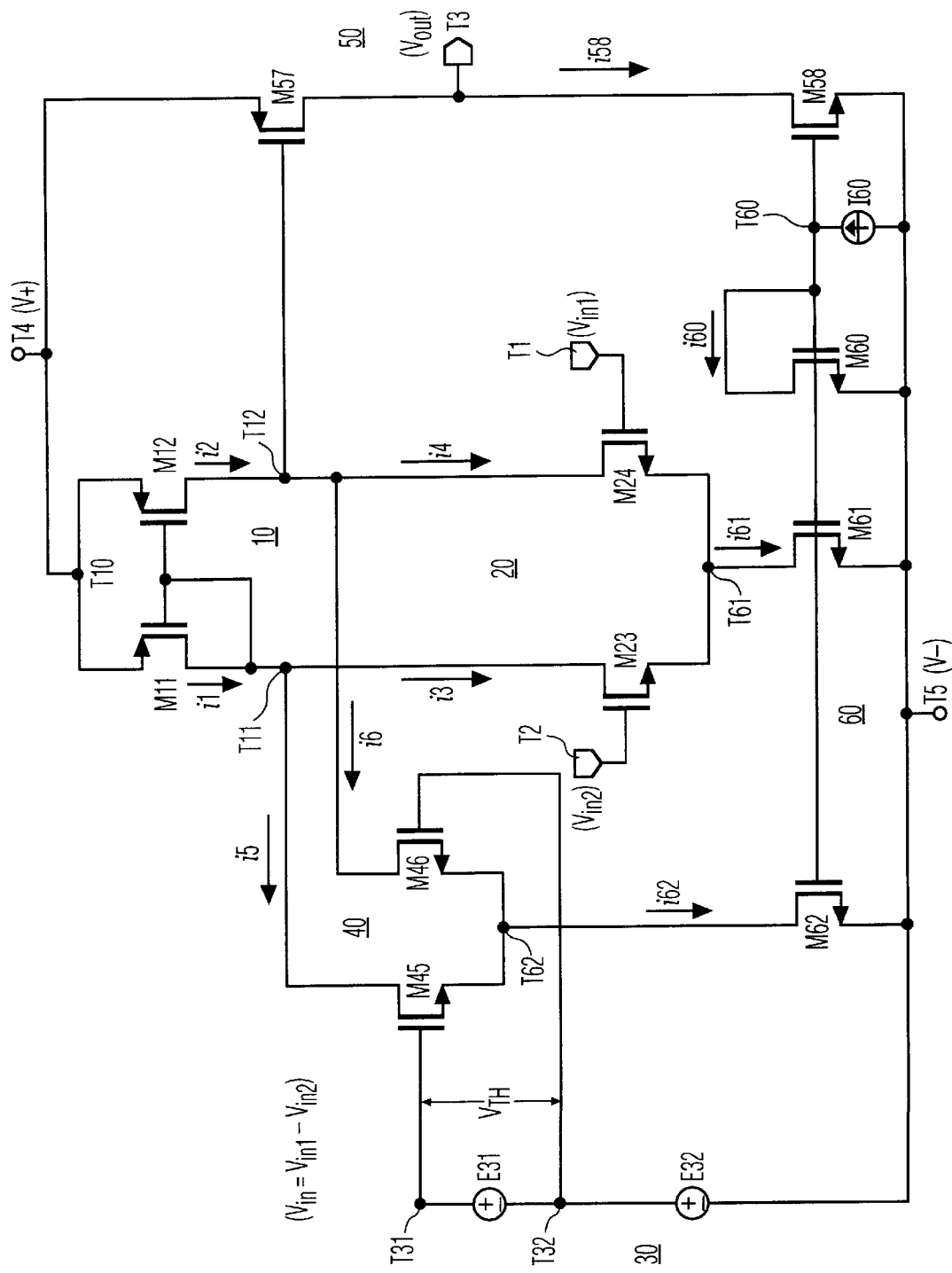
FIG. 1 is a schematic diagram of a first embodiment of a differential threshold comparator in accordance with the invention.

The first embodiment of the differential threshold comparator, illustrated in FIG. 1, includes a current mirror 10, an input stage 20, a threshold voltage source 30, a threshold stage 40, an output stage 50, and a bias current stage 60. The comparator further includes input terminals T1 and T2, output terminal T3 and power supply terminals T4 and T5. The terminals T1 and T2 are provided for receiving input signals, represented by voltages $v_{in1}$ and $v_{in2}$, respectively, that are to be compared. The terminal T3 is provided for supplying an output voltage $V_{OUT}$ which indicates whether, or not, the difference between $v_{in1}$ and $v_{in2}$ exceeds a threshold voltage $V_{TH}$. The terminals T4 and T5 are provided for connection to positive and negative supply voltages $V^+$ and $V^-$, respectively. In this exemplary embodiment, nominal supply voltages are $V^+$=3.3 volts and $V^-$=0 volt.

The current mirror 10 includes a first transistor M11 (PMOS type) having its source and drain terminals electrically connected to terminals T10 and T11, respectively, and a second transistor M12 (PMOS type) having its source and drain terminals electrically connected to terminals T10 and T12, respectively. Terminal T10 is electrically connected to terminal T4, to which the supply voltage $V^+$ is supplied. The gate and drain terminals of transistor M11 are electrically connected to each other, such that this transistor operates as an MOS diode. The current mirror 10 functions to maintain a predetermined ratio between respective currents i1 and i2 flowing through the transistors M11 and M12 and into the current mirror terminals T11 and T12, respectively. As is well known in the art, this ratio is primarily determined by the relative dimensions (i.e. lengths and widths) of the gates in the two transistors. In this embodiment, these transistors have matched gate dimensions and the currents i1 and i2 are equal to each other, i.e. have a 1:1 ratio.

The input stage 20 includes third and fourth transistors (NMOS type) M23 and M24, each having its source terminal electrically connected to a terminal T61. The drain and gate terminals of transistor M23 are electrically connected to terminals T11 and T2, respectively. The drain and gate terminals of transistor M24 are electrically connected to terminals T12 and T1, respectively. The input stage 20 is a differential comparator which functions to maintain a predetermined ratio between respective currents i3 and i4, flowing through the respective transistors M23 and M24, whenever the input voltages $v_{in1}$ and $v_{in2}$ (applied to terminals T1 and T2) are equal to each other. In this embodiment, these transistors also have matched gate dimensions and the currents i3 and i4 are equal to each other when the input voltages are equal to each other.

The threshold voltage source 30 includes a first voltage source E31, electrically connected between terminals T31 and T32, and a second voltage source E32, electrically connected between terminals T32 and T5. The source E31 supplies the threshold voltage $V_{TH}$, while the source E32 references this voltage to the supply voltage $V^-$ at terminal T5. The voltage sources E31 and E32 are shown symbolically, but in practice may be provided by any circuitry that is conveniently available. In the preferred embodiments, the differential threshold comparator is formed as an integrated circuit and the voltage sources E31 and E32 are simply serially connected resistors supplied with a predetermined current that will produce the threshold voltage $V_{TH}$. This current is supplied by a current source electrically connected to the terminal T31.

The threshold stage 40 is similar to the input stage 20 and includes fifth and sixth transistors (NMOS type) M45 and M46, each having its source terminal electrically connected to a terminal T62. The drain and gate terminals of transistor M45 are electrically connected to terminals T11 and T31, respectively. The drain and gate terminals of transistor M46 are electrically connected to Terminals T12 and T32, respectively. Transistors M45 and M46 are matched to transistors M23 and M24 (i.e. have matched gate dimensions). However, because the gate of transistor M45 is biased at a higher voltage than the gate of transistor M46 (the difference being the threshold voltage $V_{TH}$), transistor M45 will draw a current i5 from the terminal T11 which is higher than a current i6 which is drawn by transistor M46 from the terminal T12. The difference between these currents is determined by the magnitude of the threshold voltage $V_{TH}$.

The output stage 50 includes a PMOS transistor M57, having its source terminal electrically connected to the $V^+$ supply voltage terminal T4, and an NMOS transistor M58, having its source terminal electrically connected to the $V^-$ supply voltage terminal T5. The gate terminal of transistor M57 is electrically connected to the terminal T12, the gate terminal of transistor M58 is electrically connected to a terminal T60, and the drain terminals of both transistors are electrically connected to the output terminal T3. The output stage functions as a switching buffer amplifier which provides the output signal $v_{OUT}$ at terminal T3.

The bias current stage 60 includes a current source I60, electrically connected between the terminals T60 and T5, and three NMOS transistors M60, M61 and M62. The current source I60 is shown symbolically, but is formed by any current source circuit which produces a predetermined constant current i60. The source terminals of these three transistors are all electrically connected to terminal T5 and their gate terminals are all electrically connected to terminal T60. The drain terminal of transistor M60 is also electrically connected to terminal T60, providing the only path for the current I60. Because the gate terminals and the source terminals of the four transistors M58, M60, M61, M62 are commonly connected, the currents through these transistors (i58, i60, i61, i62) will depend primarily on the relative dimensions of the gates of these transistors. In the preferred embodiment, the four transistors are substantially identical except for the relative dimensions of their gates. The gate of output stage transistor M57 is sized, relative to that of transistor M11, and the gate of output stage transistor M58 is sized, relative to that of transistor M60, to effect switching operation of the output stage, as is explained herein in connection with the description of the operation of the first embodiment. The gates of the bias stage transistors M61 and M62 are sized, relative to that of transistor M60, such that the currents i61 and i62 maintain the transistors M11, M12, M23, M24, M45 and M46 in saturation over the intended operating range of the differential threshold comparator. In this embodiment, the currents i61 and i62 are substantially equal to each other.

Operation

In operation, the differential threshold comparator has three possible states:

1. an equilibrium state, which occurs whenever the input voltage ($v_{in}=v_{in1}-v_{in2}$) has a value equal to the threshold voltage $V_{TH}$;
2. an overvoltage state, which occurs whenever the input voltage $V_{in}$ has a value larger than the threshold voltage $V_{TH}$; and
3. an undervoltage state, which occurs whenever the input voltage $v_{in}$ has a value smaller than the threshold voltage $V_{TH}$.

In all states, within the intended range of operation of the comparator, the currents i61, i62, i5 and i6 remain substantially constant.

In the equilibrium state, the comparator is in balance. That is, because the input stage 20 and the threshold stage 40 have matched transistors, supply equal currents i61 and i62 to the bias stage 60, and have equal input voltages applied (i.e. $V_{TH}$):

i3=i6;
i5=i4;
i3+i5=i6+i4; and thus
i1=i2.

In this equilibrium state, the output stage transistors M57 and M58, biased by the voltages at terminals T12 and T60, respectively, carry substantially equal drain currents and have comparable output impedances. Thus the output voltage $v_{OUT}$ provided at terminal T3 has a value about midway between the supply voltages $V^+$ and $V^-$. Typically this is a transitional state.

When the input voltage $v_{in}$ increases above the threshold voltage $V_{TH}$ (i.e. the overvoltage state), the currents i61, i62, i5 and i6 remain substantially constant. This voltage increase can be caused by an absolute increase in $v_{in1}$, by an absolute decrease in $V_{in2}$, or by both of these events occurring. Regardless, current i4 will increase relative to current i3 and the equality i1=i2 can no longer exist. This will cause the voltage at terminal T12 to decrease, biasing transistor M57 into a highly conductive state, and the output voltage $v_{OUT}$ increases to nearly the positive supply voltage $V^+$.

When the input voltage $V_{in}$ decreases below the threshold voltage $V_{TH}$ (i.e. the undervoltage state), the currents i61, i62, i5 and i6 again remain substantially constant. This voltage decrease can be caused by an absolute decrease in $v_{in}$, by an absolute increase in $V_{in2}$, or by both of these events occurring. Regardless, current i4 will decrease relative to current i3 and again the equality i1=i2 can no longer exist. This will cause the voltage at terminal T12 to increase, biasing transistor M57 into a highly non-conductive state, and the output voltage $v_{OUT}$ decreases to the negative supply voltage $V^-$.

Second Embodiment

Figure 2:
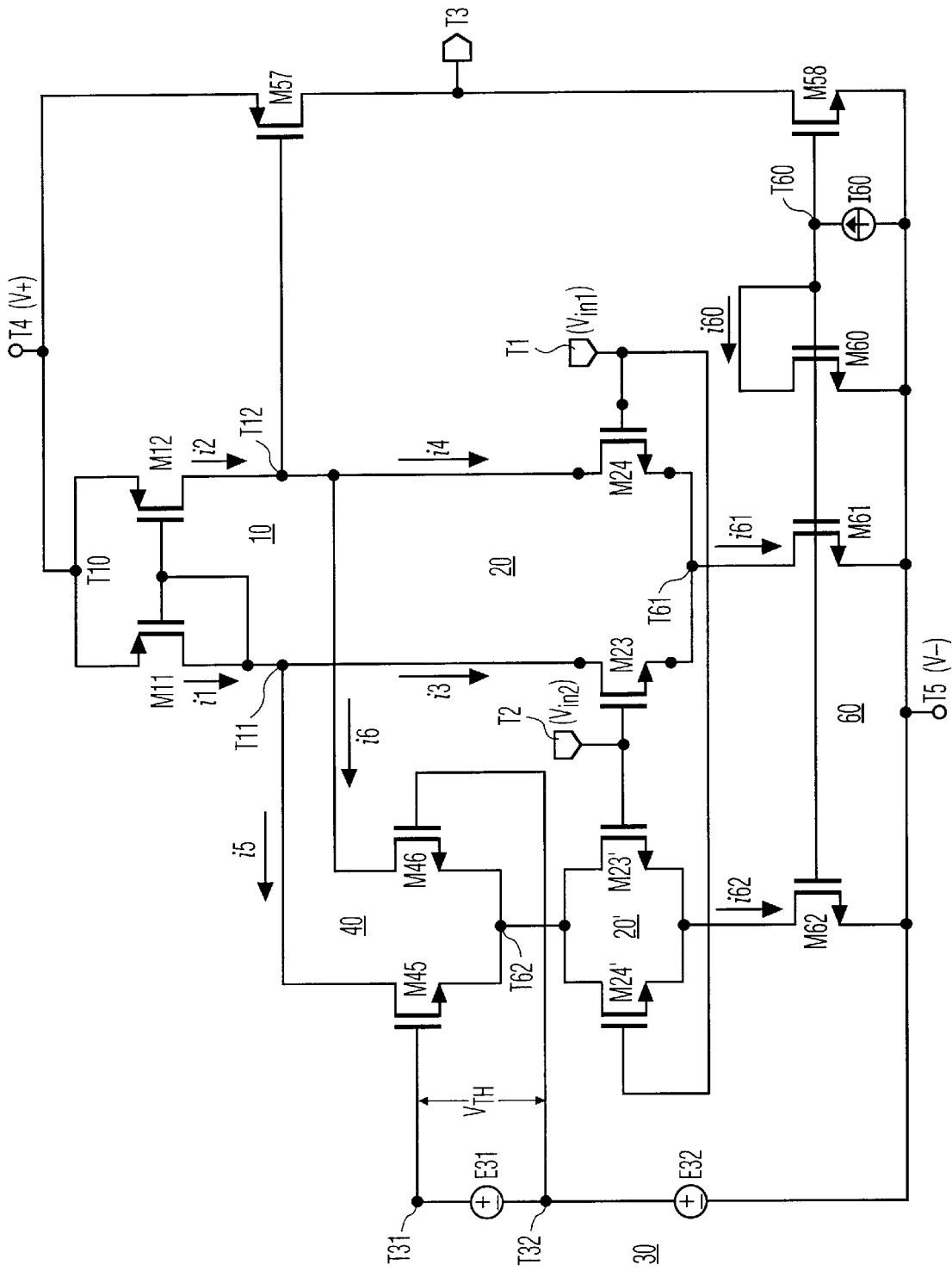
FIG. 2 is a schematic diagram of a second embodiment of a differential threshold comparator in accordance with the invention.

The second embodiment of the differential threshold comparator, shown in FIG. 2, extends the operating range of the comparator to lower common mode input voltages at terminals T1 and T2 than are acceptable for the first embodiment. In the first embodiment, if the common mode input voltage at either of terminal T1 or T2, connected to the transistors M24 and M23, decreases to a level at which the transistor M61 is operating in the triode region of its characteristic current vs. drain-source voltage curve, causing the current i61 to decrease substantially. This will limit the current passing through the transistors M24 and M23. However, the input voltages at the gates of transistors M45 and M46 are biased at voltages substantially above the common mode input voltages existing at terminals T1 and T2 and will continue to allow transistor M62 to operate in the saturation mode. Thus the current i62 will not change and will be larger than i61. This will upset the balance of the comparator and the input voltage $V_{in}$ at which the comparator output changes state will increase.

The second embodiment is identical to the first, except for the addition of a duplicate input stage 20' including NMOS transistors M23' and M24' which are matched to the transistors M23 and M24, respectively. The duplicate input stage is inserted in the comparator in electrical series with the threshold stage 40 and the bias current transistor M62. The gate terminals of transistors M23' and M24' are electrically connected to the gate terminals of the respective transistors M23 and M24 and thus receive the same input voltages. The source terminals of transistors M23' and M24' are electrically connected to the drain terminal of transistor M62 and the drain terminals of these transistors are electrically connected to each other and to the source terminals of transistors M45 and M46 in the threshold stage.

Figure 3:
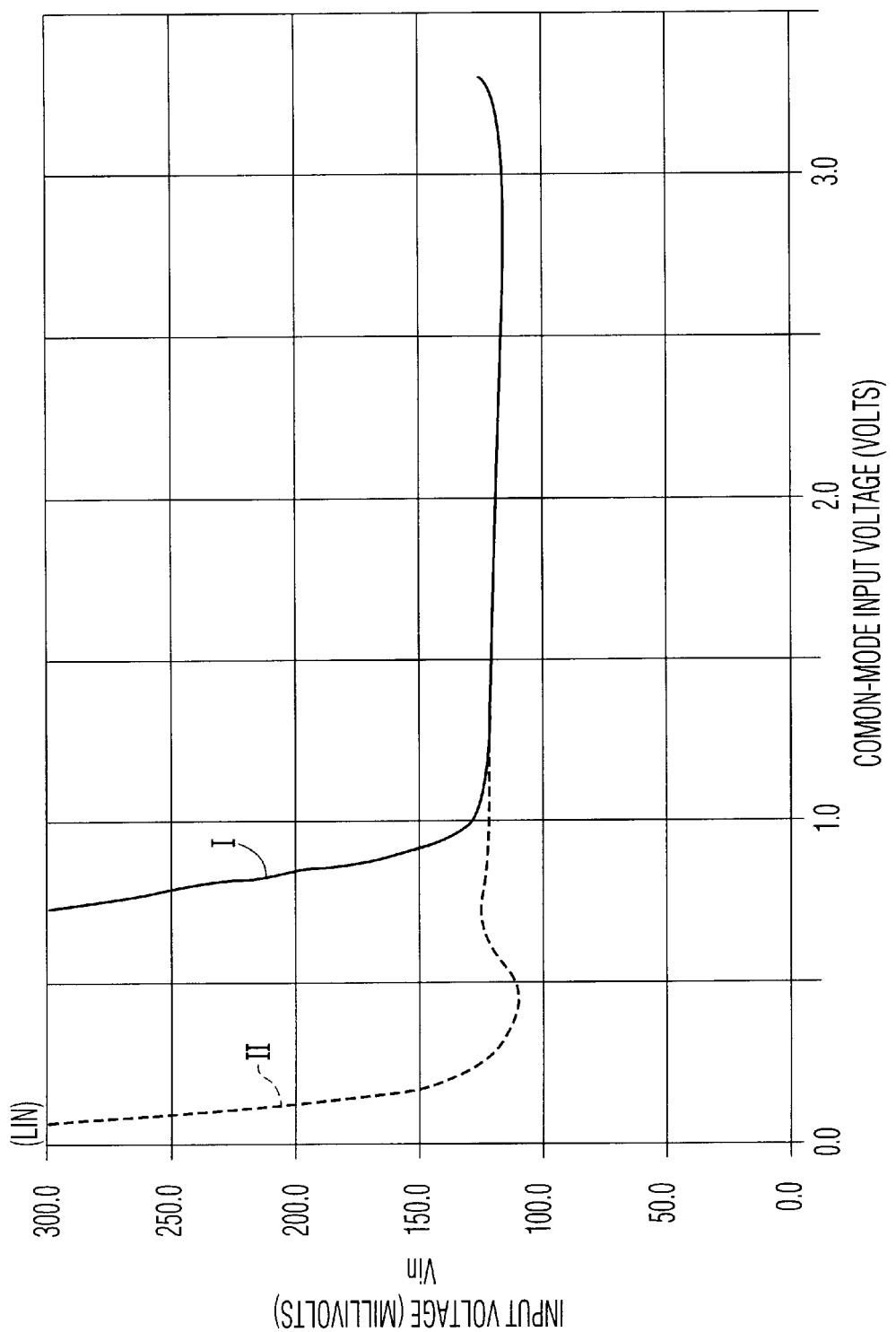
FIG. 3 is a graph showing a comparison of the stabilities of the first and second embodiments.

The second embodiment operates essentially the same way as the first, except when the input voltage at the gate terminal of either, or both, of transistors M23 and M24 decreases to a level where transistor M61 is forced to operate in the triode region. When this occurs, the corresponding transistor M62 operates in the same manner and limits current i62 such that it remains substantially equal to the current i61. This stabilizes operation of the comparator at common mode input voltages significantly below the first embodiment. This improvement is illustrated graphically in FIG. 3, which shows a comparison of the input voltage $v_{in}$ at which the comparator output changes state versus the common mode input voltage at terminals T1 and T2. In FIG. 3, the solid-line curve I represents the stability of the first embodiment, while the dashed-line curve II represents the stability of the second embodiment. These curves were developed from computer simulations of the comparator circuits of FIGS. 1 and 2 and test results of actual integrated-circuit implementations of the circuits are substantially comparable.

What is claimed is:

1. A differential threshold comparator for producing an output signal indicating whether the difference between the magnitudes of first and second input signals exceeds a predetermined threshold value, said threshold comparator comprising:

a. a plurality of terminals including a first input terminal (T1) for receiving the first input signal; a second input terminal (T2) for receiving the second input signal; an output terminal (T3) for supplying the output signal; and first (T4) and second (T5) power supply terminals;

b. a current mirror (10) having a terminal (T10) coupled to the first power supply terminal (T4), a first current mirror terminal (T11) coupled through a first transistor (M11) to terminal (T10), and a second current mirror terminal (T12) coupled through a second transistor (M12) to terminal (T10);

c. an input stage (20) including third (M23) and fourth (M24) transistors, said third transistor having a first terminal coupled to the second input terminal (T2), a second terminal coupled to the first current supply terminal (T11), and a third terminal; said fourth transistor having a first terminal coupled to the first input terminal (T1), a second terminal coupled to the second current supply terminal (T12), and a third terminal;

d. a threshold voltage source (30) coupled to the second power supply terminal (T5) and having first (T31) and second (T32) reference voltage terminals, said source providing at said reference voltage terminals respective first and second reference voltages having a difference corresponding to said threshold voltage ($V_{TH}$);

e. a threshold stage (40) including fifth (M45) and sixth (M46) transistors; said fifth transistor having a first terminal coupled to the first reference voltage terminal (T31), a second terminal coupled to the first current mirror terminal (T11), and a third terminal; said sixth transistor having a first terminal coupled to the second reference voltage terminal (T32), a second terminal coupled to the second current mirror terminal (T12), and a third terminal;

f. a bias current stage (60) including first (M61) and second (M62) current sources for supplying predetermined (equal) first and second currents to the input stage (20) and to the threshold stage (40), respectively; and a bias current source for controlling said first and second current sources; said first current source coupling the third terminals of the third (M23) and fourth (M24) transistors to the second power supply terminal (T5); and said second current source coupling the third terminals of the fifth (M45) and sixth (M46) transistors to said second power supply terminal; and g. an output buffer stage for comparing an input signal from said second current mirror terminal (T12) to a signal from said bias current source, and providing said output signal to said output terminal (T3).

2. A differential threshold comparator as in claim 1 where, in operation, said comparator has an equilibrium state where the sum of the currents through the third and fifth transistors is substantially equal to the sum of the currents through the fourth and sixth transistors.

3. A differential threshold comparator for producing an output signal indicating whether the difference between the magnitudes of first and second input signals exceeds a predetermined threshold value, said threshold comparator comprising:

a. a plurality of terminals including a first input terminal (T1) for receiving the first input signal; a second input terminal (T2) for receiving the second input signal; an output terminal (T3) for supplying the output signal; and first (T4) and second (T5) power supply terminals;

b. a current mirror (10) having a terminal (T10) coupled to the first power supply terminal (T4), a first current mirror terminal (T11) coupled through a first transistor (M11) to terminal (T10), and a second current mirror terminal (T12) coupled through a second transistor (M12) to terminal (T10);

c. an input stage (20) including third (M 23) and fourth (M24) transistors, said third transistor having a first terminal coupled to the second input terminal (T2), a second terminal coupled to the first current supply terminal (T11), and a third terminal; said fourth transistor having a first terminal coupled to the first input terminal (T1), a second terminal coupled to the second current supply terminal (T12), and a third terminal;

d. a threshold voltage source (30) coupled to the second power supply terminal (T5) and having first (T31) and second (T32) reference voltage terminals, said source providing at said reference voltage terminals respective first and second reference voltages having a difference corresponding to said threshold voltage ($V_{TH}$);

e. a threshold stage (40) including fifth (M45) and sixth (M46) transistors; said fifth transistor having a first terminal coupled to the first reference voltage terminal (T31), a second terminal coupled to the first current mirror terminal (T11), and a third terminal; said sixth transistor having a first terminal coupled to the second reference voltage terminal (T32), a second terminal coupled to the second current mirror terminal (T12), and a third terminal coupled to the third terminal of the fifth transistor;

f. a duplicate input stage (20') including seventh (M23') and eighth (M24') transistors having electrical characteristics which substantially match corresponding electrical characteristics of the third (M23) and fourth (M24) transistors, respectively; said seventh transistor having a first terminal coupled to the second input terminal (T2), a second terminal, and a third terminal; said eighth transistor having a first terminal coupled to the first input terminal (T1), a second terminal, and a third terminal; said second terminals of the seventh and eighth transistors being mutually coupled to each other and to the third terminals of the fifth (M45) and sixth (M46) transistors so as to electrically connect the threshold stage (40) and the duplicate input stage in series;

g. a bias current stage (60) including first (M61) and second (M62) current sources for supplying predetermined (equal) first and second currents to the input stage (20) and to the threshold stage (40), respectively; and a bias current source for controlling said first and second current sources; said first current source coupling the third terminals of the third (M23) and fourth (M24) transistors to the second power supply terminal (T5); and said second current source coupling the third terminals of the seventh (M23') and eighth (M24') transistors to said second power supply terminal; and h. an output buffer stage for comparing an input signal from said second current mirror terminal (T12) to a signal from said bias current source, and providing said output signal to said output terminal (T3).

* * * * *